United States Patent
Xu et al.

(10) Patent No.: US 10,290,659 B2
(45) Date of Patent: May 14, 2019

(54) METHODS FOR MANUFACTURING DISPLAY PANELS HAVING REDUCED CONTACT RESISTANCE, DISPLAY PANELS AND DISPLAY DEVICES

(71) Applicants: BOE TECHNOLOGY GROUP CO., LTD., Beijing (CN); ORDOS YUANSHENG OPTOELECTRONICS CO., LTD., Ordos (CN)

(72) Inventors: Haifeng Xu, Beijing (CN); Dawei Shi, Beijing (CN); Wentao Wang, Beijing (CN); Lu Yang, Beijing (CN); Zifeng Wang, Beijing (CN); Xiaowen Si, Beijing (CN)

(73) Assignees: BOE Technology Group Co., Ltd., Beijing (CN); Ordos Yuansheng Optoelectronics Co., Ltd., Ordos (CN)

( * ) Notice: Subject to any disclaimer, the term of this patent is extended or adjusted under 35 U.S.C. 154(b) by 16 days.

(21) Appl. No.: 15/526,048

(22) PCT Filed: May 10, 2016

(86) PCT No.: PCT/CN2016/081519
§ 371 (c)(1),
(2) Date: May 11, 2017

(87) PCT Pub. No.: WO2017/161647
PCT Pub. Date: Sep. 28, 2017

(65) Prior Publication Data
US 2018/0166473 A1    Jun. 14, 2018

(30) Foreign Application Priority Data
Mar. 22, 2016 (CN) .......................... 2016 1 0165425

(51) Int. Cl.
*G06F 3/041* (2006.01)
*H01L 27/12* (2006.01)

(52) U.S. Cl.
CPC ........ *H01L 27/1262* (2013.01); *G06F 3/0412* (2013.01); *H01L 27/12* (2013.01); *H01L 27/124* (2013.01); *G06F 2203/04103* (2013.01)

(58) Field of Classification Search
CPC ... H01L 27/1262; H01L 27/12; H01L 27/124; G06F 3/0412
See application file for complete search history.

(56) References Cited

U.S. PATENT DOCUMENTS

2002/0085157 A1    7/2002    Tanaka et al.
2002/0109796 A1    8/2002    Lin et al.
(Continued)

FOREIGN PATENT DOCUMENTS

CN    102881653 A    1/2013
CN    103064207 A    4/2013
(Continued)

OTHER PUBLICATIONS

Office Action from Chinese Application No. 201610165425.7 dated Mar. 29, 2018 (10 pages).
(Continued)

*Primary Examiner* — Lisa S Landis
(74) *Attorney, Agent, or Firm* — Harness, Dickey & Pierce, P.L.C.

(57) ABSTRACT

The present disclosure relates to a method for manufacturing a display panel, a display panel and a display device. There is provided a method for manufacturing a display panel, comprising: forming a first metal layer on a substrate; forming a second metal layer on the first metal layer; oxidizing a portion of the second metal layer to form an oxide extending to a surface of the first metal layer; remov-
(Continued)

ing the oxide to expose the surface of the first metal layer; and forming a conductive layer on the exposed surface of the first metal layer.

20 Claims, 2 Drawing Sheets

(56) References Cited

U.S. PATENT DOCUMENTS

| | | |
|---|---|---|
| 2003/0160252 A1 | 8/2003 | Jeong et al. |
| 2010/0176394 A1 | 7/2010 | Park et al. |
| 2011/0074749 A1* | 3/2011 | Higashi .................. H01L 27/12 345/206 |
| 2014/0027760 A1 | 1/2014 | Chang et al. |
| 2014/0117359 A1 | 5/2014 | Yuan et al. |
| 2014/0117363 A1 | 5/2014 | Koresawa et al. |
| 2014/0127891 A1 | 5/2014 | Chen et al. |
| 2015/0137112 A1 | 5/2015 | Cheng et al. |
| 2017/0045984 A1 | 2/2017 | Lu et al. |
| 2017/0148819 A1 | 5/2017 | Lin et al. |
| 2018/0088725 A1 | 3/2018 | Yang et al. |

FOREIGN PATENT DOCUMENTS

| | | | |
|---|---|---|---|
| CN | 103077943 A | | 5/2013 |
| CN | 103578984 A | | 2/2014 |
| CN | 103650149 | * | 3/2014 |
| CN | 103650149 A | | 3/2014 |
| CN | 103811417 A | | 5/2014 |
| CN | 104716144 A | | 6/2015 |
| CN | 104850268 | * | 8/2015 |
| CN | 104850268 A | | 8/2015 |
| CN | 104992925 A | | 10/2015 |
| CN | 105161620 A | | 12/2015 |
| JP | S61289648 A | | 12/1986 |

OTHER PUBLICATIONS

International Search Report from corresponding PCT Application No. PCT/CN2016/081519 dated Dec. 19, 2016 (4 pages).
Written Opinion of the International Search Report from corresponding PCT Application No. PCT/CN2016/081519 dated Dec. 19, 2016 (5 pages).

* cited by examiner ical solutions of the embodiments of the present disclosure, the drawings of the embodiments will be briefly described below. It should be understood that the drawings described below merely relate to some embodiments of the present disclosure rather than limit the present disclosure, in which:

METHODS FOR MANUFACTURING DISPLAY PANELS HAVING REDUCED CONTACT RESISTANCE, DISPLAY PANELS AND DISPLAY DEVICES

CROSS-REFERENCES TO RELATED APPLICATIONS

This patent application claims priority of Chinese Patent Application No. 201610165425.7, filed on Mar. 22, 2016, the entire content of which is incorporated by reference herein.

FIELD OF THE DISCLOSURE

The present disclosure relates to the field of display technology, and in particular, to a method for manufacturing a display panel, a display panel and a display device.

BACKGROUND

In the design of existing TFT-LCD display product array, especially full-in-Cell touch products, a transparent oxide layer such as ITO, as a common electrode, often needs to be connected with a source/drain (S/D) electrode layer to transmit signals. During a time-division drive, this common electrode transmits a common voltage signal (Vcom) in the display phase and transmits a touch signal during the touch phase. However, a contact resistance between a conductive material used for a S/D material in a low temperature polysilicon (LTPS) process and the common electrode layer is too large, thereby deteriorating the display and touch performance of the display panel.

BRIEF SUMMARY OF THE DISCLOSURE

An embodiment of the present disclosure provides a method for manufacturing a display panel, which can at least partially alleviate the problem that contact resistance is increased due to the presence of interface oxide between conductive wires.

In one aspect of the present disclosure, there is provided a method for manufacturing a display panel, comprising:
  forming a first metal layer on a substrate;
  forming a second metal layer on the first metal layer;
  oxidizing a portion of the second metal layer to form an oxide extending to a surface of the first metal layer;
  removing the oxide to expose the surface of the first metal layer; and
  forming a conductive layer on the exposed surface of the first metal layer.

Further, the second metal layer has a thickness of 500 to 1000 angstroms.

Further, the method further comprises patterning the first metal layer to form a source/drain electrode layer, and the conductive layer acts as a common electrode in the display phase and as a touch electrode in the touch phase.

Further, prior to the oxidation, an isolation layer is formed on the second metal layer and the isolation layer is patterned to form an opening that exposes the portion of the second metal layer.

Further, the oxidation comprises oxygen exposure of the second metal layer after the opening is formed.

Further, the oxygen exposure comprises at least one of:
  a step of transferring the substrate between process steps;
  an annealing step after patterning the isolation layer; and
  an ashing step of the isolation layer before forming the conductive layer.

Further, the removing the oxide comprises removing the oxide at the bottom of the opening to expose a top surface of the first metal layer.

Further, the oxide is removed by wet etching using the isolation layer as a protective layer.

Further, the conductive layer is formed on the top surface of the isolation layer, on the sidewall of the opening and on the exposed top surface of the first metal layer.

Further, the first metal layer comprises a Ti/Al/Ti stack or a Mo/Al/Mo stack, the second metal layer comprises Al or Ag, and the conductive layer comprises a transparent conductive layer.

Further, the first metal layer comprises a Ti/Al/Ti stack and the second metal layer comprises Al, wherein the first metal layer and the second metal layer are formed by successively depositing Ti, Al, Ti, and Al layers.

Further, the transparent conductive layer comprises ITO.

Further, the isolation layer comprises a resin.

Further, the oxide is removed by a dilute sulfuric acid solution.

In another aspect of the present disclosure, there is provided a display panel, comprising:
  a first metal layer formed on a substrate;
  a second metal layer formed on the first metal layer, wherein the second metal layer has an opening that exposes a top surface of the first metal layer; and
  a conductive layer in the opening and on the top surface of the first metal layer.

Further, the second metal layer has a thickness of 500 to 1000 angstroms.

Further, the first metal layer comprises a source/drain electrode layer, and the conductive layer acts as a common electrode in the display phase and as a touch electrode in the touch phase.

Further, there is comprised an isolation layer on the second metal layer, wherein the isolation layer has another opening, the another opening being aligned with the opening of the second metal layer.

Further, the conductive layer is located on a top surface of the isolation layer, on sidewalls of the another opening of the isolation layer and of the opening of the second metal layer and on the exposed top surface the first metal layer.

Further, the first metal layer comprises a Ti/Al/Ti stack or a Mo/Al/Mo stack, the second metal layer comprises Al or Ag, and the conductive layer comprises a transparent conductive layer.

Further, the first metal layer comprises a Ti/Al/Ti stack and the second metal layer comprises Al.

Further, the transparent conductive layer comprises ITO.

Further, the isolation layer comprises a resin.

In a yet another aspect of the present disclosure, there is provided a display device comprising the above-described display panel.

BRIEF DESCRIPTION OF THE DRAWINGS

In order to more clearly illustrate the technical solutions of the embodiments of the present disclosure, the drawings of the embodiments will be briefly described below. It should be understood that the drawings described below merely relate to some embodiments of the present disclosure rather than limit the present disclosure, in which.

DETAILED DESCRIPTION

Figure 1:
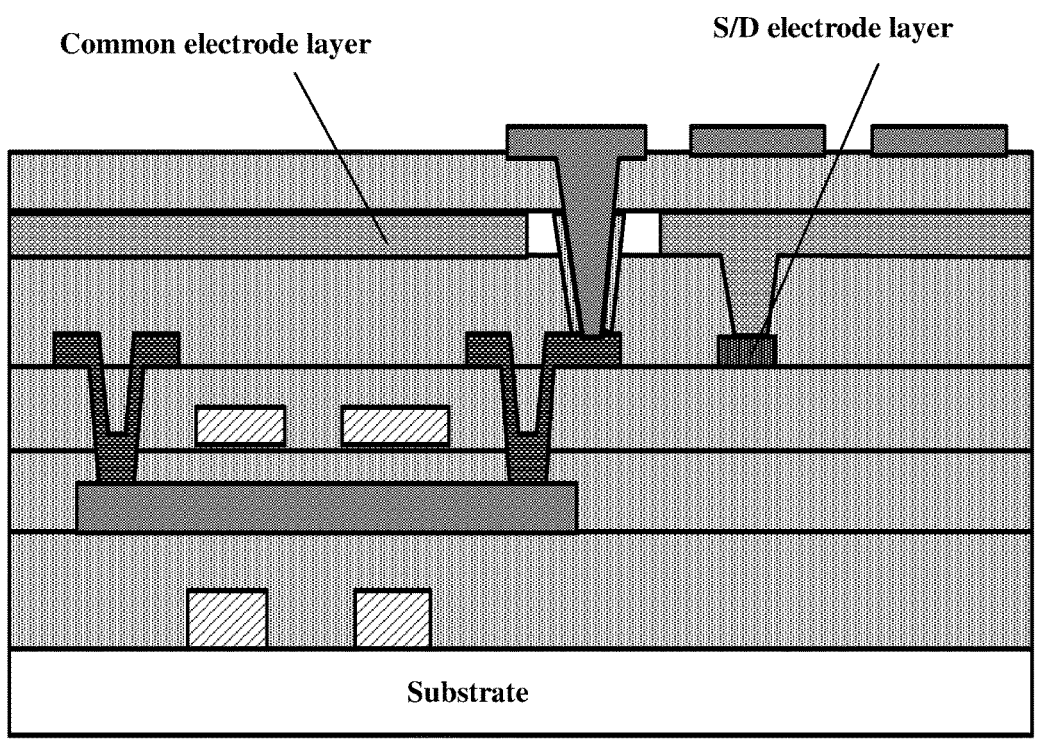
FIG. 1 shows a structural diagram of an full-in-cell display panel.

To make the purpose, technical solutions, and advantages of the present disclosure more clear, the technical solutions of the embodiments of the present disclosure will be clearly and completely described below in conjunction with the drawings. Obviously, the embodiments described are part of embodiments of the present disclosure, instead of all the embodiments. Based on the described embodiments of the present disclosure, all other embodiments obtained by those skilled in the art without creative work also fall within the scope of protection sought for by the present disclosure.

The terms "a", "one", "this" and "the" are intended to indicate the presence of one or more elements when elements of the present disclosure and their embodiments are introduced. The terms "comprising", "including", "containing" and "having" are intended to be inclusive and indicate that there may be additional other elements than the listed elements. For the purpose of the following description, the terms "upper", "lower", "left", "right", "vertical", "horizontal", "top", "bottom" and derivatives thereof, shall involve the disclosure as in the denoted direction in the drawings. The terms "on", "on top of . . . ", "located on . . . ", or "located on top of . . . " mean the presence of a first element such as a first structure on a second element such as a second structure, wherein an intermediate element such as an interface structure may be present between the first element and the second element.

FIG. 1 shows a block diagram of an full-in-cell display panel in which a common electrode layer is electrically connected to an S/D electrode layer through a via formed in a isolation material. This common electrode layer may comprise any transparent conductive material, such as ITO. The S/D electrode layer comprises any conductive metal, such as a Ti/Al/Ti stack or a Mo/Al/Mo stack. The inventors have found upon test that there is contact resistance between the common electrode layer and the S/D electrode layer, which may make the S/D electrode layer fail to be used as a transmission electrode of a transparent conductive layer to which the touch metal wires are connected, thereby having potential adverse effects on the display panel. To this end, the inventors have made extensive studies which indicate that the contact resistance is related to the oxide present between the S/D electrode layer and the common electrode layer, and further that the oxide is caused by the subsequent treatment after the S/D electrode layer is formed, and is hard to remove. For example, when the S/D electrode layer is manufactured using a Ti/Al/Ti metal stack, the Ti metal at the uppermost layer has an oxidation risk in the case of an oxygen exposure occurred at a plasma environment or during switching from a high temperature to a low temperature, to form titanium oxide. The titanium oxide adheres to the surface of the Ti/Al/Ti stack and is water-insoluble, and can be removed only by hot concentrated sulfuric acid, while this treatment can severely damage the surrounding structure and even scrap the entire product.

In view of the above problems, an embodiment of the present disclosure provides a method for manufacturing a display panel, comprising: forming a first metal layer on a substrate; forming a second metal layer on the first metal layer; oxidizing a portion of the second metal layer to form an oxide extending to a surface of the first metal layer; removing the oxide to expose the surface of the first metal layer; and forming a conductive layer on an exposed surface of the first metal layer. With this method, the second metal is used as a sacrificial layer material for potential oxidation and can effectively prevent the formation of oxides on the surface of the first metal layer, thereby reducing the contact resistance between the first metal layer and the subsequently formed conductive layer. According to an embodiment of the present disclosure, the above oxidation may include any oxygen exposure process after the second metal layer is formed. It is to be understood that the present disclosure is not limited to the material of the second metal layer as a sacrificial layer and comprises any metal or alloy as long as the oxide of the second metal layer can be easily removed and the removal has no adverse effects or only minor effects on the performance of the display panel.

An embodiment of the method of manufacturing a display panel of the present disclosure will be described below with reference to the accompanying drawings.

Figure 2:
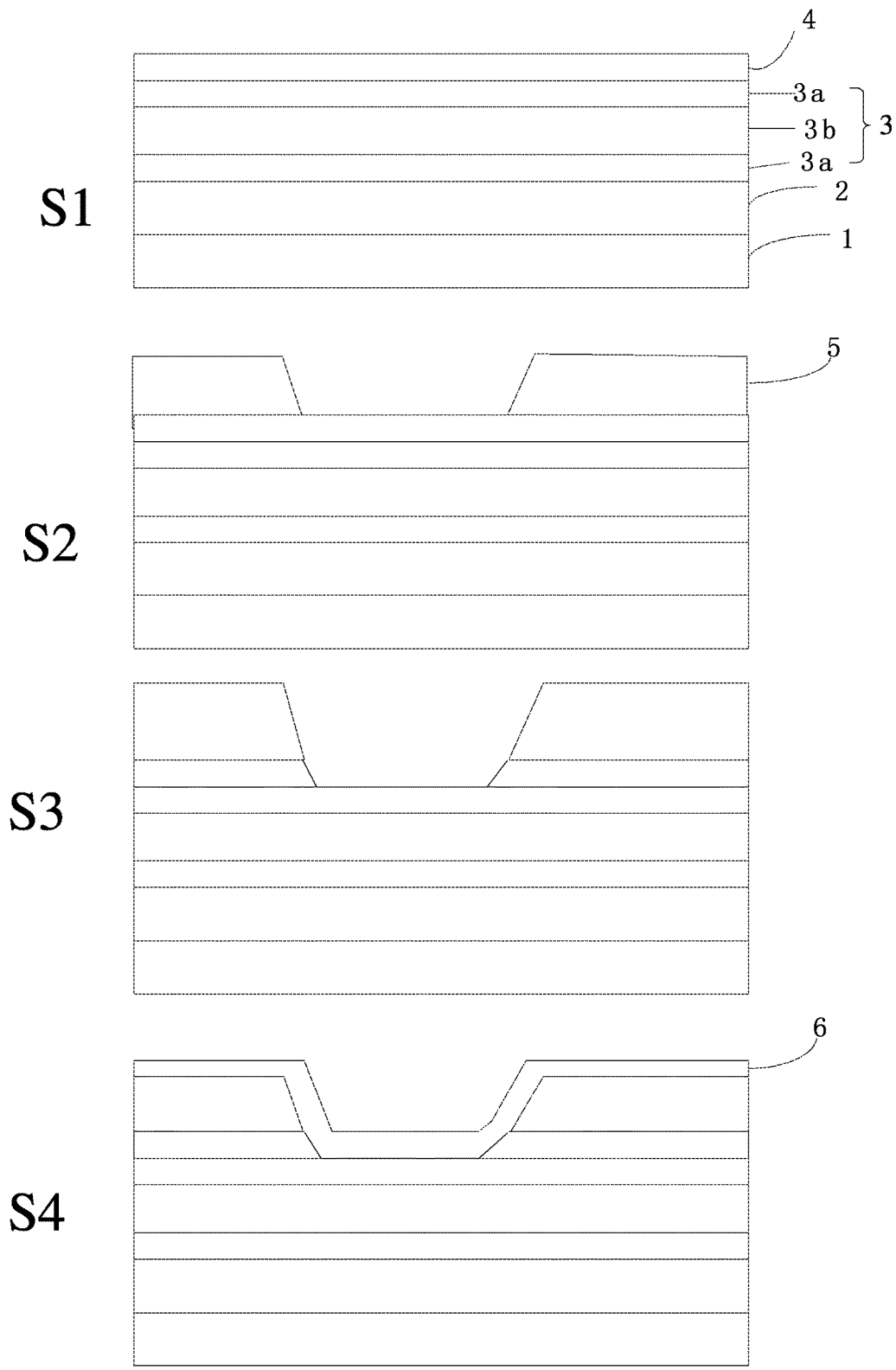
FIG. 2 shows a method of manufacturing a display panel according to an embodiment of the present disclosure.

FIG. 2 shows a method of manufacturing a display panel according to an embodiment of the present disclosure. In this method, the first metal layer acts as a source/drain electrode layer of the display panel, and the conductive layer is a transparent conductive layer such as ITO formed on the source/drain electrode layer. According to an embodiment of the present disclosure, preferably, when the display panel is driven in time-division drive, the transparent conductive layer acts as a common electrode in the display phase to provide a common voltage ($V_{com}$) and as a touch electrode in the touch phase.

As shown in FIG. 2, during step S1, a source/drain electrode layer 3 is formed on a substrate 1 including the previous process layer 2 formed before the formation of the source/drain electrode layer, and the source/drain electrode layer 3 comprises a Ti/Al/Ti stack or a Mo/Al/Mo stack, preferably a Ti/Al/Ti stack. The substrate 1 may be any transparent substrate, including but not limited to glass, PMMA, PET and PC. The source/drain electrode layer may be formed using a well-known film forming process in the art, including but not limited to, evaporation and sputtering. In FIG. 2, the source/drain electrode layer 3 as shown uses a Ti/Al/Ti stack in which the layer 3a is a Ti layer and the layer 3b is an Al layer. Accordingly, in the case where the Mo/Al/Mo stack is used, the layer 3a is a Mo layer.

In addition, during step S1, a sacrificial protective metal layer is further formed as a second metal layer 4 on the source/drain electrode layer 3, and the second metal layer 4 may be Al or Ag. In the case where the Ti/Al/Ti stack is used as the source/drain electrode layer, Al is preferably used as the second metal layer 4. According to an embodiment of the present disclosure, the source/drain electrode layer 3 and the second metal layer 4 may be formed by different film forming steps or consecutively formed in the same film forming step. Alternatively, the combination of the first and second metal layers may be patterned simultaneously to form the source/drain electrode layer. Preferably, according to an embodiment of the present disclosure, in the case where the Ti/Al/Ti stack is used as the source/drain electrode layer 3 and Al as the second metal layer 4, the Ti, Al, Ti and Al layers may be consecutively formed in turn to form the source/drain electrode layer 3 and the second metal 4 synchronously. In addition, the thickness of the second metal layer 4 of the present disclosure is not particularly limited as long as the second metal layer can protect the underlying metal layer from being oxidized. Preferably, the second metal layer has a thickness of 500 to 1000 angstroms.

Next, during step S2, an isolation layer 5 is formed on the second metal layer 4 by a well-known process in the art, and the isolation layer 5 comprises any isolation material, such as a resin. Thereafter, the isolation layer is patterned by exposure and development to form an opening that exposes a portion of the second metal layer 4. According to an embodiment of the present disclosure, after a portion of the second metal layer 4 is exposed, the portion is oxidized due to the exposure to an oxygen-containing environment (i.e., oxygen exposure). That is, according to the scheme of the present disclosure, it is not necessary to intentionally oxidize the exposed portion of the second metal layer 4, and this oxidization process can be accomplished spontaneously in the LTPS process, for example. According to an embodiment of the present disclosure, the oxygen exposure comprises, but is not limited to, at least one of: a step of transferring the substrate between process steps, an annealing step for securing the isolation layer after patterning the isolation layer, and an ashing step performed on the isolation layer before forming the conductive layer. Wherein the ashing step is capable of roughening the surface of the isolation layer to increase the adhesion strength of the conductive layer to be formed to prevent stripping off. Through the oxidation, the entire exposed portion of the second metal layer 4 is converted into an oxide, and in the case where the second metal layer is Al, the oxide is $Al_2O_3$.

It is noted that although not shown in FIG. 2, it will be understood by those skilled in the art that the source/drain electrode layer 3 and the second metal 4 may be patterned by a well-known patterning process in the art prior to the formation of the isolation layer 5 to obtain a desired electrode shape. For example, a mask is first formed, and then an etching process such as dry or wet etching is used to remove the portions to be removed of the source/drain electrode layer 3 and the second metal layer 4.

Next, during step S3, the oxide of the second metal layer 4 at the bottom of the opening is removed to expose the sidewall of the second metal 4 and the top surface of the source/drain electrode layer 3. According to an embodiment of the present disclosure, alternatively, an isolation layer 5 is used as a protective layer to remove the oxide by wet etching. Alternatively, the isolation layer 5 is annealed prior to the etching to cure or harden the isolation layer to better withstand corrosion of the etchant. According to an embodiment of the present disclosure, an etchant for ITO, such a dilute sulfuric acid solvent, may be used as an etchant for wet etching. In particular, it is preferable to use a dilute sulfuric acid solution to remove $Al_2O_3$ when the second metal layer 4 is Al.

Next, during step S4, a conductive layer 6 is formed on the top surface of the isolation layer 5 and on the sidewall and bottom surface of the opening. According to an embodiment of the present disclosure, the conductive layer 6 may be formed by a sputtering method such as megnetron sputtering. As a result, a good electrical contact is formed between the conductive layer 6 and the source/drain electrode layer 3, thereby improving the performance of the display panel.

In summary, the method of manufacturing a display panel of the present disclosure can effectively remove the interface oxide between metal wires and reduce the contact resistance.

The present disclosure further provides a display panel, comprising: a first metal layer 3 formed on a substrate 1; a second metal layer 4 formed on the first metal layer 3, wherein the second metal layer has an opening to expose a top surface of the first metal layer; and a conductive layer 6 in the opening and on the top surface of the first metal layer 3.

According to an embodiment of the present disclosure, the second metal layer 4 preferably has a thickness of 500 to 1000 angstroms.

According to an embodiment of the present disclosure, the first metal layer 3 comprises a source/drain electrode layer, and the conductive layer 6 acts as a common electrode in the display phase and as a touch electrode in the touch phase.

According to an embodiment of the present disclosure, the display panel further comprises an isolation layer 5 on the second metal layer 4, wherein the isolation layer preferably comprises a resin material. Further, the isolation layer 5 has another opening which is aligned with the opening of the second metal layer 4. The conductive layer 6 is located on the top surface of the isolation layer 5, on the sidewalls of the another opening of the isolation layer 5 and of the opening of the second metal layer 4 and on the exposed top surface of the first metal layer 3.

According to an embodiment of the present disclosure, the first metal layer 3 comprises a Ti/Al/Ti stack or a Mo/Al/Mo stack, the second metal layer 4 comprises Al or Ag, and the conductive layer 6 comprises a transparent conductive layer, for example, ITO. Alternatively, the first metal layer 3 comprises a Ti/Al/Ti stack and the second metal layer 4 comprises Al.

Accordingly, an embodiment of the present disclosure further provides a display device comprising the above-described display panel. The display device comprises, but is not limited to, any product or component having a display function such as a mobile phone, a tablet computer, a television set, a monitor, a notebook computer, a digital photo frame, a navigator, or the like.

Some particular embodiments have been described, and these embodiments are presented by way of example only and are not intended to limit the scope of the present disclosure. In fact, the novel embodiments described herein may be embodied in various other forms; furthermore, various omissions, substitutions and alterations in the form of embodiments described herein may be made without departing from the spirit of the disclosure. The appended claims and their equivalents are intended to cover such forms or modifications which fall within the spirit and scope of the present disclosure.

What is claimed is:

1. A method for manufacturing a display panel, the method comprising:
   forming a first metal layer on a substrate;
   forming a second metal layer on the first metal layer;
   oxidizing a portion of the second metal layer to form an oxide extending to a surface of the first metal layer;
   removing the oxide to expose the surface of the first metal layer; and
   forming a conductive layer on the exposed surface of the first metal layer.

2. The method according to claim 1, wherein the second metal layer has a thickness of 500 to 1000 angstroms.

3. The method according to claim 1, further comprising patterning the first metal layer to form a source electrode layer or a drain electrode layer, wherein the conductive layer is a common electrode in a display phase and a touch electrode in a touch phase.

4. The method according to claim 3, further comprising forming an isolation layer on the second metal layer and patterning the isolation layer to form an opening that exposes the portion of the second metal layer, prior to oxidizing the portion of the second metal layer.

5. The method according to claim 4, wherein, oxidizing the portion of the second metal layer comprises exposing the second metal layer to oxygen after the opening is formed.

6. The method according to claim 5, wherein exposing the second metal layer to oxygen to oxygen comprises at least one of:
- a step of transferring the substrate between process steps;
- an annealing step after patterning the isolation layer; and
- an ashing step of the isolation layer before forming the conductive layer.

7. The method according to claim 4, wherein removing the oxide comprises removing the oxide at a bottom of the opening to expose a top surface of the first metal layer.

8. The method according to claim 7, wherein removing the oxide comprises wet etching and wherein the isolation layer is a protective layer.

9. The method according to claim 7, wherein forming the conductive layer comprises forming the conductive layer on a top surface of the isolation layer, on a sidewall of the opening and on the exposed top surface of the first metal layer.

10. The method according to claim 1, wherein the first metal layer comprises a Ti/Al/Ti stack or a Mo/Al/Mo stack, wherein the second metal layer comprises Al or Ag, and wherein the conductive layer comprises a transparent conductive layer.

11. The method according to claim 10, wherein the first metal layer comprises a Ti/Al/Ti stack, wherein the second metal layer comprises Al, and wherein the first metal layer and the second metal layer are formed by successively depositing Ti, Al, Ti, and Al layers.

12. The method according to claim 1, wherein removing the oxide comprising removing the oxide with a dilute sulfuric acid solution.

13. A display panel comprising:
- a first metal layer disposed on a substrate;
- a second metal layer disposed on the first metal layer, wherein the second metal layer defines an opening that exposes a top surface of the first metal layer; and
- a conductive layer disposed in the opening and on the top surface of the first metal layer.

14. The display panel according to claim 13, wherein the second metal layer has a thickness of 500 to 1000 angstroms.

15. The display panel according to claim 13, wherein the first metal layer comprises a source electrode layer or a drain electrode layer, and wherein the conductive layer is a common electrode in a display phase and a touch electrode in a touch phase.

16. The display panel according to claim 13, further comprising an isolation layer disposed on the second metal layer, wherein the isolation layer defines an opening aligned with the opening of the second metal layer.

17. The display panel according to claim 16, wherein the conductive layer is located on a top surface of the isolation layer, sidewalls of the opening of the isolation layer, sidewalls of the opening of the second metal layer, and the exposed top surface of the first metal layer.

18. The display panel according to claim 13, wherein the first metal layer comprises a Ti/Al/Ti stack or a Mo/Al/Mo stack, wherein the second metal layer comprises Al or Ag, and wherein the conductive layer comprises a transparent conductive layer.

19. The display panel according to claim 18, wherein the first metal layer comprises a Ti/Al/Ti stack and wherein the second metal layer comprises Al.

20. A display device comprising the display panel according to claim 13.

* * * * *